(12) United States Patent
Kuroda

(10) Patent No.: US 8,379,455 B2
(45) Date of Patent: Feb. 19, 2013

(54) NONVOLATILE SEMICONDUCTOR STORAGE DEVICE INCLUDING FAILURE DETECTION CIRCUIT AND METHOD OF DETECTING FAILURE ON NONVOLATILE SEMICONDUCTOR STORAGE DEVICE

(75) Inventor: Yoshikazu Kuroda, Kanagawa (JP)

(73) Assignee: Renesas Electronic Corporation, Kanagawa (JP)

( * ) Notice: Subject to any disclaimer, the term of this patent is extended or adjusted under 35 U.S.C. 154(b) by 219 days.

(21) Appl. No.: 13/019,316

(22) Filed: Feb. 2, 2011

(65) Prior Publication Data

US 2011/0194345 A1 Aug. 11, 2011

(30) Foreign Application Priority Data

Feb. 8, 2010 (JP) ................................. 2010-025973

(51) Int. Cl.
*G11C 11/34* (2006.01)
(52) U.S. Cl. ................................ 365/185.2; 365/185.24
(58) Field of Classification Search ............... 365/185.2, 365/185.24
See application file for complete search history.

(56) References Cited

U.S. PATENT DOCUMENTS

| 6,407,953 B1 * | 6/2002 | Cleeves ......................... 365/201 |
| 2004/0246793 A1 * | 12/2004 | Yamagami ..................... 365/200 |
| 2008/0144380 A1 * | 6/2008 | Youn et al. ............... 365/185.09 |

FOREIGN PATENT DOCUMENTS

| JP | 9-245492 | 9/1997 |
| JP | 3621334 | 11/2004 |

* cited by examiner

*Primary Examiner* — Michael Tran
(74) *Attorney, Agent, or Firm* — Young & Thompson

(57) ABSTRACT

A nonvolatile semiconductor storage device includes: a word line; a reading circuit; and a failure detection circuit. The word line is connected to gates of a plurality of nonvolatile memory cell transistors. The reading circuit is connected to one end of the word line and supplies one of a reading selection voltage and a reading non-selection voltage to the word line. The failure detection circuit is connected to the other end of the word line and detects a voltage of the word line supplied with the one of the reading selection voltage and the reading non-selection voltage by comparing the voltage with a plurality of reference voltages.

10 Claims, 7 Drawing Sheets

US 8,379,455 B2

NONVOLATILE SEMICONDUCTOR STORAGE DEVICE INCLUDING FAILURE DETECTION CIRCUIT AND METHOD OF DETECTING FAILURE ON NONVOLATILE SEMICONDUCTOR STORAGE DEVICE

INCORPORATION BY REFERENCE

This application is based upon and claims the benefit of priority from Japanese patent application No. 2010-025973 filed on Feb. 8, 2010, the disclosure of which is incorporated herein in its entirety by reference.

BACKGROUND OF THE INVENTION

1. Field of the Invention

The present invention relates to a nonvolatile semiconductor storage device including a failure detection circuit and a method of detecting a failure on a nonvolatile semiconductor storage device.

2. Description of Related Art

In a typical nonvolatile semiconductor storage device, especially, a flash memory, a cell size is large. For this reason, a cell reading current is large and a reading rate is low. As a result, in such the nonvolatile semiconductor storage devices, a cell reading margin is relatively large. That is, variation in a voltage applied to a cell at a reading operation due to manufacturing variations is insignificant. Therefore, in inspection of the nonvolatile semiconductor storage device, for example, as for a word line, it is enough to be able to check presence or absence of short-circuit and disconnection in the word line and check application of a voltage to the word line, and thus a value of the voltage does not constitute a matter of concern.

Japanese Patent Publication JP-A-Heisei 9-245492 discloses a nonvolatile semiconductor storage device as an art related to the above-mentioned inspection. The nonvolatile semiconductor storage device includes a word driver, a word line non-selection level supply circuit and a sense amplifier. The word driver drives a word line with a selection level. The word line non-selection level supply circuit is provided at a far end part of the word line and supplies a non-selection level with a supply capacity lower than the supply capacity of the word driver. The sense amplifier is provided at a data line. In absence of a failure in the word line, the selection level is applied to the word lines for all cells, resulting in that a data reading state is uniform in all cells. However, in presence of disconnection in the word line, the selection level is applied to the word line on a side of the word driver from a disconnection part and the non-selection level is applied to the word line on a side of the word line non-selection level supply circuit from the disconnection part. Therefore, the word line voltage varies across the disconnection part as a boundary. Thus, since the data reading state varies according to cells, a failure on the word line can be detected by sensing the difference.

Japanese Patent No. JP3621334B1 (corresponding U.S. Pat. No. 6,307,778 (B1)) discloses a nonvolatile memory device. The nonvolatile memory device includes an REG, a word line driver, a memory cell and a comparator circuit. The word line driver uses a main word line of a REG output as a power source. The memory cell is connected to a sub word line as an output of the word line driver. The comparator circuit compares a current of the REG with Iref. At this time, when short-circuit occurs in the word line, the REG passes a current even after driving of the word line and the current becomes equal to or greater than a value of Iref. The result is outputted from the comparator, thereby detecting a failure.

SUMMARY

The inventor has now discovered the following facts.

In a nonvolatile semiconductor storage device (a flash memory) in recent years, however, to meet a demand for higher integration, higher rate and lower power consumption, a cell size has been reduced, a cell reading current has become smaller and a reading rate has become higher. For this reason, in such nonvolatile semiconductor storage devices, a cell reading margin is extremely small.

FIG. 1 is a graph schematically showing relationship between a current flowing to a flash memory cell and a word line voltage. A vertical axis indicates a current flowing to a cell (cell current: Icell), and a horizontal axis indicates a word line voltage, that is, a gate voltage Vg of a nonvolatile memory cell transistor as the cell. Among curves in the graph, a curve represented as "ON cell" shows a cell current-gate voltage characteristic of a cell (nonvolatile memory cell transistor) where electrons are not accumulated. A curve represented as "OFF cell" shows a cell current-gate voltage characteristic of a cell where electrons are accumulated. Vwg represents an expected value of the word line voltage (selection voltage) applied to a word line when it is selected and is substantially the same as a gate voltage (word gate voltage). The word line voltage (non-selection voltage) applied to the word line when it is not selected is often a GND voltage (0 V).

As shown in FIG. 1, to enable a sense amplifier to determine a cell as the ON cell, a current flowing to the cell needs to be equal to or larger than a current Ib. That is, the gate voltage is equal to or larger than Vwga (minimum value). To enable the sense amplifier to determine a cell as the OFF cell, the current flowing to the cell needs to be equal to or smaller than a current Ia. That is, the gate voltage is equal to or smaller than Vwgb (maximum value). The currents Ia and Ib are determined depending on a transistor characteristic of the sense amplifier. Thus, a reading margin $\Delta V_M$ of a word line voltage Vwg becomes (Vwgb−Vwga).

To increase the reading margin $\Delta V_M$ of the word line voltage (gate voltage) Vwg, it is necessary to shift a characteristic of the ON cell (curve "ON cell") to a low-potential side and/or shift a characteristic of the OFF cell (curve "OFF cell") to a high-potential side. That is, it is necessary to increase a difference in a threshold voltage Vt between the ON cell and the OFF cell. Thus, when data is written to the cell and is erased from the cell, an electron injection amount to the cell and the electron emission amount from the cell need to be increased. However, increases in the electron injection amount and the electron emission amount in such a cell contribute to deterioration of the cell. Especially because the cell size has become smaller in recent years, the increases can have a larger impact on the deterioration, which is undesirable. Therefore, to suppress the deterioration, it is preferred to decrease the electron injection amount and the electron emission amount in the cell. In other words, it is preferred to decrease the reading margin $\Delta V_M$ of the word line voltage (gate voltage) Vwg rather than to increase it.

However, when such a small reading margin $\Delta V_M$ is set, even if the word line voltage (selection voltage) Vwg increases or decreases only by a few tens of mV, the word line voltage may exceed a range of the reading margin $\Delta V_M$. Therefore, it is necessary to check a value of the selection voltage in the word line voltage with high accuracy and ensure that the value falls within the range of the reading margin $\Delta V_M$. On the other hand, when the electron injection amount and the electron emission amount of the cell that caused by writing and erasure are decreased, the difference in the threshold voltage Vt between the ON cell and the OFF cell becomes smaller and therefore, an effect of variation in the threshold voltage Vt becomes large. Thus, it is necessary to check a value of the non-selection voltage in the word line voltage with high accuracy and ensure that the value is a desired value (or a desired range). That is, it is necessary to ensure both the selection voltage value and the non-selection voltage value of the word line with high accuracy.

According to a technique disclosed in the above-mentioned Patent literature 1 (JP-A-Heisei 09-245492), a failure in the word line is detected based on a difference between reading results of the cell. Therefore, it is difficult to detect a minute difference (difference of a few tens of mV) between the expected value and the word line voltage. The reason is as follows. To ensure the word line voltage value based on the reading results of the cell, it is required to finely fabricate a cell. To ensure the word line voltage value by the cell fine fabrication, the cell is finely fabricated such that a cell voltage is previously set to a voltage Vtm which is slightly lower than the expected value of the election voltage. When the cell is read in this state, the cell that the expected voltage value is applied to the word line is turned ON, and the cell that a voltage value lower than the expected value is applied to the word line is not turned ON. This difference ensures the selection voltage value. However, it is difficult to finely fabricate the cell with the cell voltage to the required voltage Vtm, and the voltage Vtm often varies by about a few tens of mV to a few hundreds of mV. For this reason, a difference of the word line voltage by about a few tens of mV cannot be checked.

According to a technique disclosed in the above-mentioned Patent literature 2 (JP3621334B1), a failure is detected based on magnitude of a REG current. For this reason, although short-circuit in the word line can be detected, a word line voltage value cannot be checked. Further, a word line voltage indetermination state in which no current flows cannot be detected. That is, since a failure is detected by monitoring the current, variation in voltage values due to short-circuit with the other power source through a high resistor, where no current flows, cannot be detected. In addition, the word line voltage indetermination state at non-selection due to a failure on an application path of the non-selection voltage, where no current flows, cannot be detected.

The present invention seeks to solve one or more of the above problems, or to improve upon those problems at least in part.

In one embodiment, a nonvolatile semiconductor storage device includes: a word line configured to be connected to gates of a plurality of nonvolatile memory cell transistors; a reading circuit configured to be connected to one end of said word line and supply one of a reading selection voltage and a reading non-selection voltage to said word line; and a failure detection circuit configured to be connected to the other end of said word line and detect a voltage of said word line supplied with said one of said reading selection voltage and said reading non-selection voltage by comparing said voltage with a plurality of reference voltages.

In another embodiment, a method of detecting a failure on a nonvolatile semiconductor storage device, includes: supplying one of a reading selection voltage and a reading non-selection voltage to a word line connected to gates of a plurality of nonvolatile memory cell transistors from one end of said word line; and detecting a voltage of said word line at the other end of said word line by comparing said voltage with a plurality of reference voltages.

According to the present invention, both a selection voltage value and a non-selection voltage value of the cell can be checked with high accuracy and a selection gate voltage value can be ensured.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, embodiments of a nonvolatile semiconductor storage device having a failure detection circuit according to the present invention will be described with reference to attached drawings.

(First Embodiment)

A nonvolatile semiconductor storage device having a failure detection circuit according to a first embodiment of the present invention will be described below with reference to attached drawings.

Figure 2:
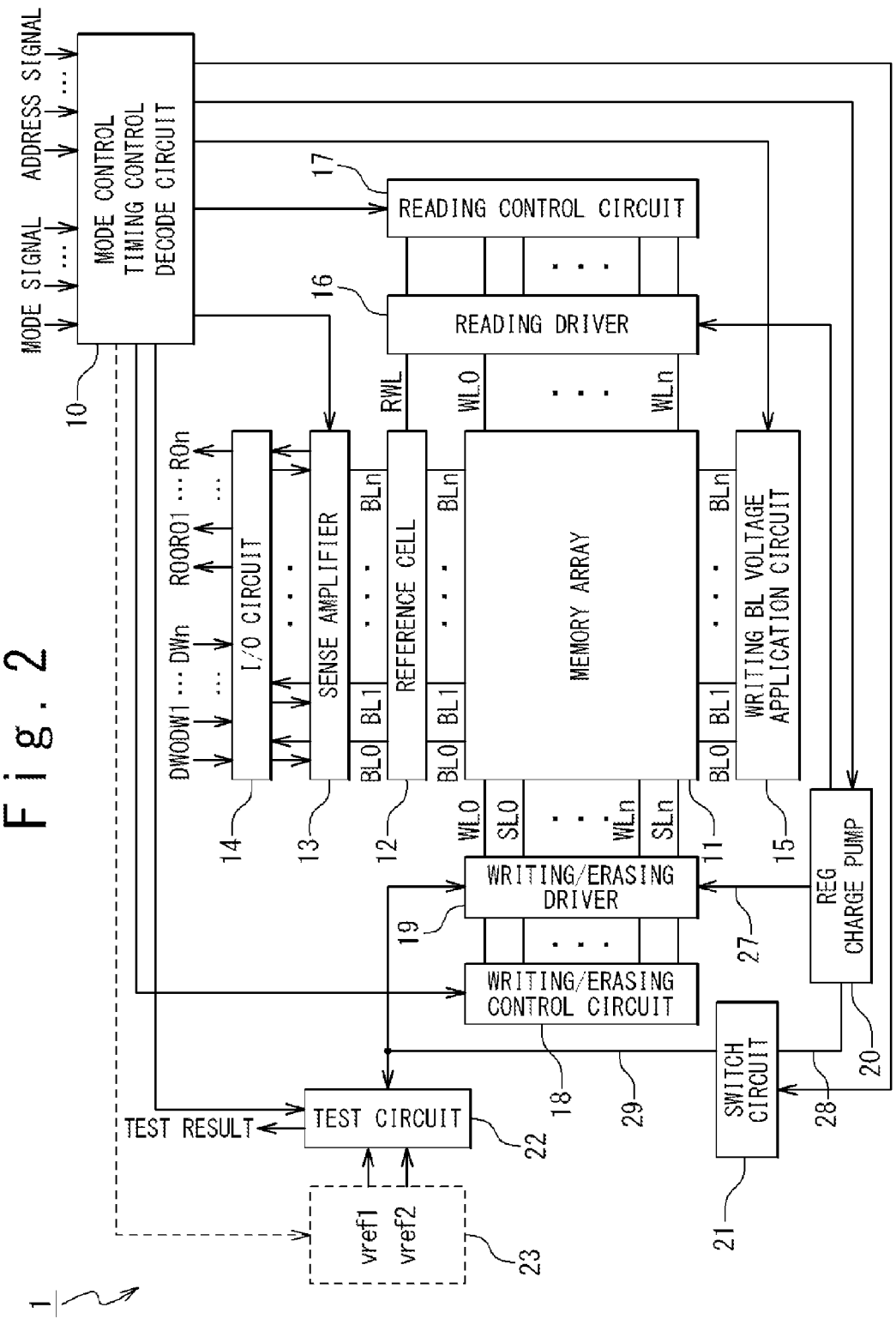
FIG. 2 is a block diagram showing a configuration of a nonvolatile semiconductor storage device according to embodiments of the present invention.

First, a configuration of the nonvolatile semiconductor storage device according to the first embodiment of the present invention will be described referring to FIGS. 2 and 3. FIG. 2 is a block diagram showing a configuration of the nonvolatile semiconductor storage device according to the first embodiment of the present invention. A nonvolatile semiconductor storage device 1 is a flash memory. The nonvolatile semiconductor storage device 1 includes a control circuit (mode control timing control decode circuit) 10, a memory array 11, a reading driver 16, a reading control circuit 17, a writing/erasing driver 19, a writing/erasing control circuit 18, a writing BL voltage application circuit 15, a reference cell 12, a sense amplifier 13, an I/O circuit 14, a REG charge pump 20, a switch circuit 21 and a test circuit 22.

The memory array 11 includes a plurality of memory cells arranged in a matrix shape. Each memory cell is a flash memory cell (nonvolatile memory cell transistor). Examples of the flash memory cell include a floating gate-type flash memory cell and an MONOS (Metal/Oxide/Nitride/Oxide/Silicon)-type flash memory cell. Each memory cell is connected to a word line WL at its (word) gate, a bit line BL at its drain and a source line SL at its source. Operations of the memory cell are controlled by voltages supplied to the lines. The word line WL and the (word) gate may be substantially integral with each other.

The reading driver 16 is provided on one side of the memory array 11 and is connected to one end of the word line WL (WL0, WL1, ..., WLn). The reading driver 16 drives the word line WL with a reading selection voltage or a reading non-selection voltage generated by the REG charge pump 20 (or by itself). The reading control circuit 17 controls the reading driver 16 according to a signal from the control circuit 10.

The writing/erasing driver 19 is provided on the other side of the memory array 11 (that is, a side opposed to the reading driver 16) and is connected to the other end of the word line WL (WL0, WL1, ..., WLn) and the source line SL (SL0, SL1, ..., SLn). The writing/erasing driver 19 drives the word line WL with a writing selection voltage or a writing non-selection voltage, or an erasure selection voltage or an erasure non-selection voltage, which is generated by the REG charge pump 20. Further, the writing/erasing driver 19 drives the source line SL with a source line selection voltage or a source line non-selection voltage that is generated by the REG charge pump 20. The writing/erasing control circuit 18 controls the writing/erasing driver 19 according to a signal from the control circuit 10.

The writing BL voltage application circuit 15 is provided on one side of the memory array 11 that is different from the side on which the reading driver 16 and the writing/erasing driver 19 are provided, and is connected to one end of the bit line BL (BL0, BL1, ..., BLn). In a writing operation, the writing BL voltage application circuit 15 applies a voltage to the bit line BL according to a signal from the control circuit 10.

The reference cell 12 is provided on one side of the memory array 11 that is opposed to the side on which the writing BL voltage application circuit 15 is provided. The sense amplifier 13 is provided next to the reference cell 12. The sense amplifier 13 compares an output of a memory cell to be read, which is supplied through the bit line BL, and an output of the reference cell 12 according to a signal from the control circuit 10 and reads data in the memory cell. The I/O circuit 14 outputs the read data to the outside or receives a writing data for a target memory cell.

The REG charge pump 20 functions as a regulator and a charge pump. The REG charge pump 20 supplies the reading selection voltage and the reading non-selection voltage to the reading driver 16 according to a signal from the control circuit 10. The REG charge pump 20 also supplies the writing selection voltage or the writing non-selection voltage, the erasure selection voltage or the erasure non-selection voltage, the source line selection voltage or the source line non-selection voltage to the writing/erasing driver 19 based on a signal from the control circuit 10. The REG charge pump 20 supplies the source line selection voltage or the source line non-selection voltage to the writing/erasing driver 19 via a wire 27. The REG charge pump 20 supplies the writing selection voltage or the writing non-selection voltage, the erasure selection voltage or the erasure non-selection voltage to the writing/erasing driver 19 via a wiring 28.

The switch circuit 21 is provided between the REG charge pump 20 and the writing/erasing driver 19, and between the wiring 28 and a wiring 29. In a failure detection test by using the test circuit 22, a path of the wiring 28 is blocked. In other words, the switch circuit 21 blocks a connection between the other end of the word line WL and the REG charge pump 20.

The test circuit (failure detection circuit) 22 is provided between the REG charge pump 20 and the writing/erasing driver 19. The test circuit 22 is arranged at a position along the wiring 29 in the side of the writing/erasing driver 19 (word line WL) with respect to the switch circuit 21. The test circuit 22 is connected to the wiring 29 between the writing/erasing driver 19 and the switch circuit 21. In other words, the test circuit 22 is provided opposite to the reading driver 16 across the word line WL. In performing the failure detection test, the test circuit 22 detects an actual word line voltage based on comparison between the reading selection voltage or the reading non-selection voltage that is supplied from the reading driver 16 to the word line WL and a plurality of reference voltages (ex. Vref1, Vref2).

To provide the plurality of reference voltages (ex. Vref1, Vref2), the nonvolatile semiconductor storage device 1 may have a reference voltage generation circuit 23. The reference voltage generation circuit 23 generates the plurality of reference voltages based on a control signal from the control circuit 10 and supplies the reference voltages to the test circuit 22. Alternatively, the plurality of reference voltages may be supplied from an external tester (not shown) connected to the test circuit 22 through an external connection terminal (not shown).

By blocking the path (wirings 28, 29) from the REG charge pump 20 by means of the switch circuit 21, the test circuit 22 can perform the failure detection test without being affected by a state of the element located on the path from the REG charge pump 20. Further, by blocking the path (wirings 28, 29) from the REG charge pump 20 by means of the switch circuit 21, the test circuit 22 can compare a voltage supplied to the reading driver 16 through the writing/erasing driver 19 with the voltages Vref1 and Vref2 applied from the outside. Based on a comparison result, it is possible to determine a state of the reading driver 16, or whether or not a word line selection voltage value and a non-selection voltage value fall within a predetermined range. That is, the test circuit 22 can determine whether the word line voltage value is in the range or out of the range.

Figure 3:
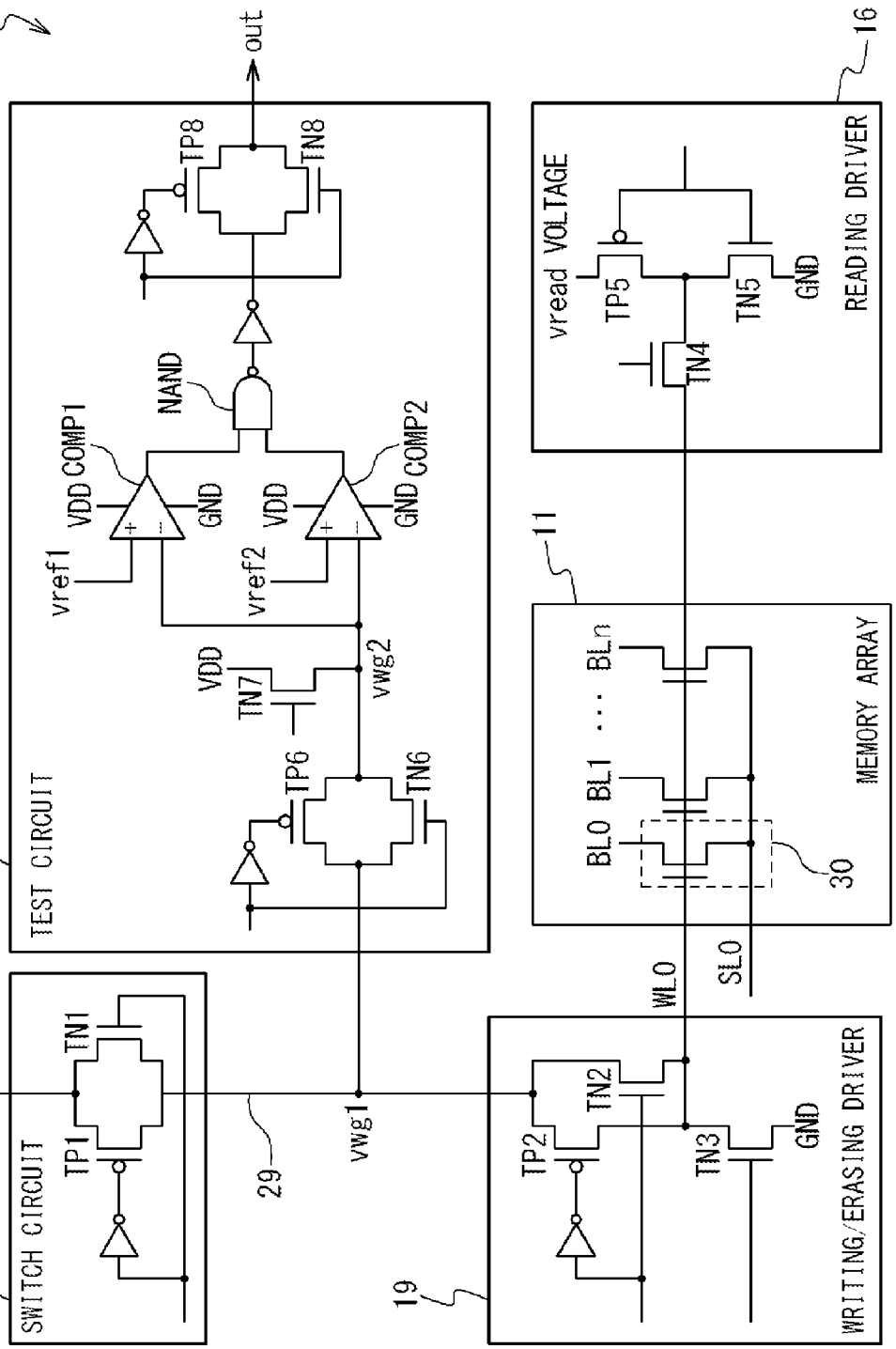
FIG. 3 is a block diagram showing a configuration of a test circuit and the surroundings according to a first embodiment of the present invention.

FIG. 3 is a block diagram showing a configuration of the test circuit and the surroundings according to the first embodiment of the present invention. This figure shows details of the test circuit 22 and the switch circuit 21, and details of portions of the writing/erasing driver 19, the memory array 11 and the reading driver 16. As for each of the memory array 11, the reading driver 16 and the writing/erasing driver 19, the portions related to only one word line (word line WL0) are shown. The portions related to other word lines WL (WL1, ..., WLn) are the same as the portions shown in this figure.

The reading driver 16 includes an inverter composed of a pMOS transistor TP5 and an nMOS transistor TN5. A high-potential side is connected to a Vread voltage corresponding to the reading selection voltage, and a low-potential side is connected to a GND voltage corresponding to the reading non-selection voltage. An output of the inverter is connected to one end of the word line WL (WL0) through an nMOS transistor TN4 that functions as a switch. An input of the inverter receives a signal based on a control signal from the control circuit 10.

In the memory array 11, a plurality of memory cells 30 is aligned along the word line WL. The memory cell 30 is a flash memory cell (nonvolatile memory cell transistor). The memory cell 30 is connected to the word line WL at its gate, to the source line SL at its source and to the bit line BL at its drain.

The writing/erasing driver 19 includes an inverter, a transfer gate formed of a pMOS transistor TP2 and an nMOS transistor TN2, and an nMOS transistor TN3. The nMOS transistor TN3 is connected to a GND voltage at its source and to one node of the transfer gate at its drain. The other end of the word line WL is connected to the node. The wiring 29 is connected to the other node of the transfer gate. Signals based on control signals from the control circuit 10 are supplied to a gate of the nMOS transistor TN3 and gates of the MOS transistors in the transfer gate, respectively.

The switch circuit 21 includes an inverter, a transfer gate formed of a pMOS transistor TP1 and an nMOS transistor TN1. One node of the transfer gate is connected to both of the writing/erasing driver 19 and the test circuit 22 through the wiring 29. The other node of the transfer gate is connected to the REG charge pump 20 through the wiring 28. Signals based on a control signal from the control circuit 10 are supplied to gates of the MOS transistors in the transfer gate, respectively.

The test circuit 22 includes an inverter, a transfer gate formed of a pMOS transistor TP6 and an nMOS transistor TN6, an nMOS transistor TN7, comparators COMP1 and COMP2, an AND (NAND+NOR) circuit, an inverter and a transfer gate formed of a pMOS transistor TP8 and an nMOS transistor TN8.

One node of the transfer gate (TP6, TN6) is connected to the wiring 29 (between the writing/erasing driver 19 and the switch circuit 21). A drain of the nMOS transistor TN7 is connected to a power source VDD and a source of the nMOS transistor TN7 is connected to the other node of the transfer gate (TP6, TN6). The comparator COMP1 is connected to the other node of the transfer gate (TP6, TN6) at its inverting input, to the reference voltage Vref1 at its non-inverting input and to one input of the AND (NAND+NOR) circuit at its output. The comparator COMP2 is connected to the other node of the transfer gate (TP6, TN6) at its inverting input, to the reference voltage Vref2 at its non-inverting input and to the other input of the AND (NAND+NOR) circuit at its output. One node of the transfer gate (TP8, TN8) is connected to an output of the AND (NAND+NOR) circuit. A signal outputted from the other node of the transfer gate (TP8, TN8) is an output (out) of the test circuit 22. Signals based on a control signal from the control circuit 10 are supplied to gates of the MOS transistors in the transfer gate (TP6, TN6), a gate of the nMOS transistor TN7 and gates of the MOS transistors in the transfer gate (TP8, TN8).

By blocking the path (wiring 28) from the REG charge pump 20 by the switch circuit 21 in this manner, the output (word line voltage) of the reading driver 16 can be compared with the reference voltages Vref1 and Vref2 in the test circuit 22 through the writing/erasing driver 19. Further, by comparing the word line voltage (selection voltage, non-selection voltage) with the plurality of reference voltages, it is possible to measure whether or not the word line voltage falls within a predetermined voltage range and ensure a voltage value. That is, the test circuit 22 can determine whether the word line voltage is in the range or out of the range. In addition, whether or not a failure exists in the reading driver 16 can be detected based on absence or presence of abnormality in the word line voltage.

Incidentally, by providing more comparators and reference voltages in the test circuit 22, the word line voltage can be measured (detected) in more detail. The test circuit 22 may be provided on the opposite side to the reading driver 16 across the word line WL and may be directly connected to the word line WL through a switch or the like.

Figure 4:
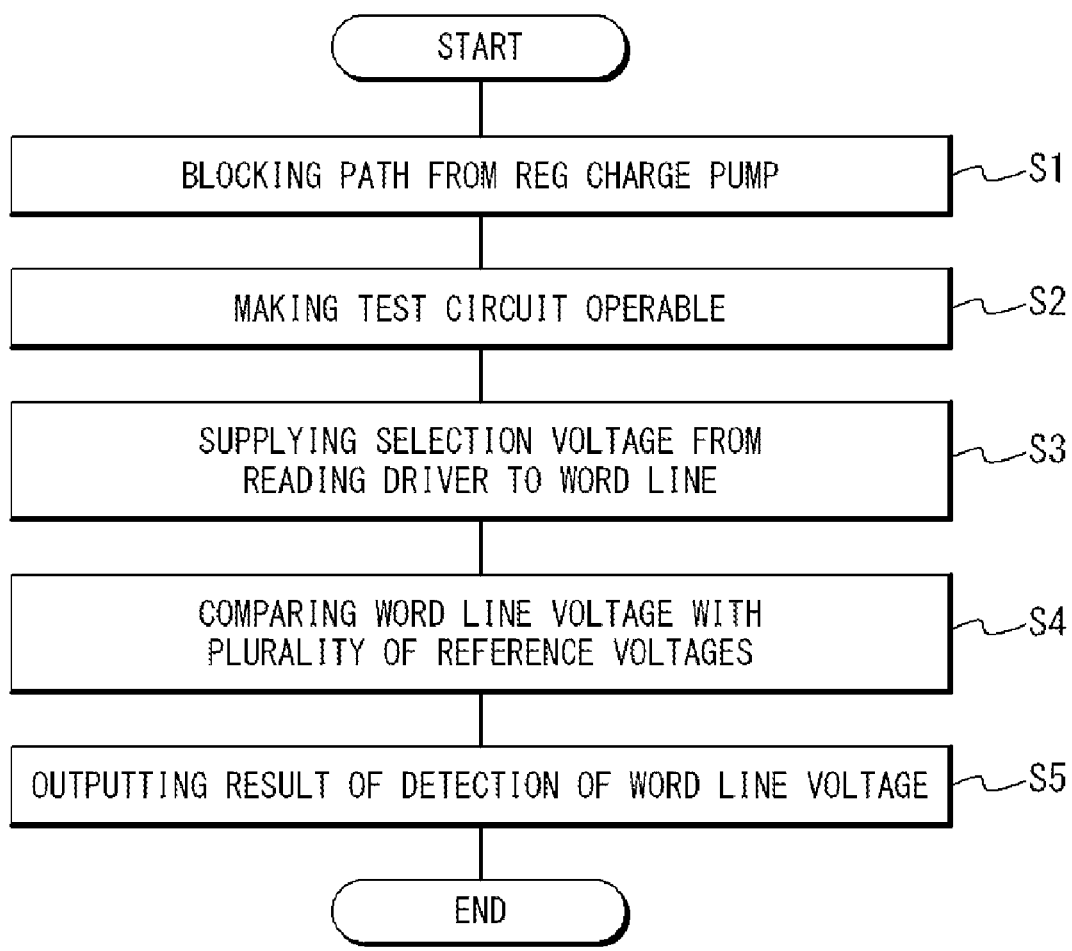
FIG. 4 is a flowchart showing an operation of the nonvolatile semiconductor storage device according to the embodiments of the present invention.
Figure 5:
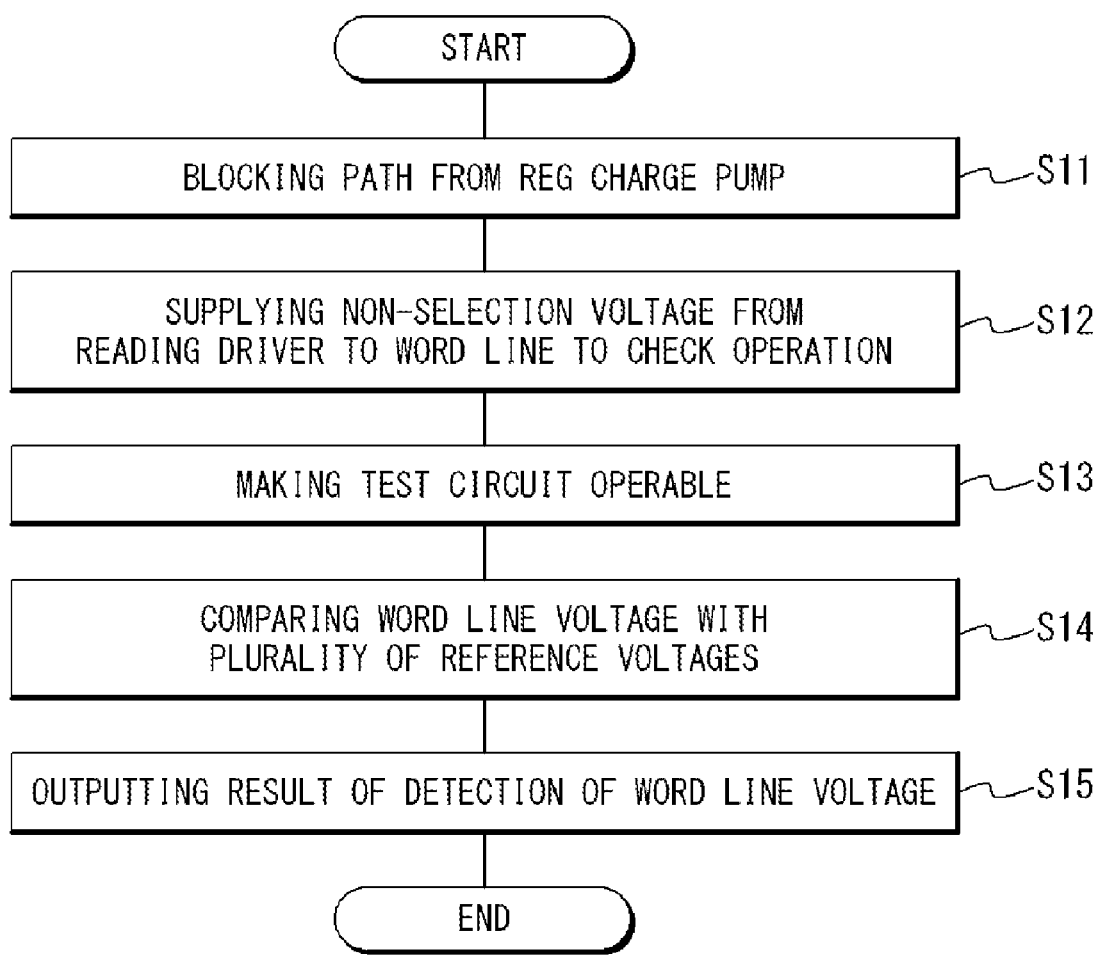
FIG. 5 is a flowchart showing an operation of the nonvolatile semiconductor storage device according to the embodiments of the present invention.

Next, an operation of the nonvolatile semiconductor storage device (method of inspecting or detecting a failure on the nonvolatile semiconductor storage device) according to the first embodiment of the present invention will be described referring to FIG. 3 to FIG. 5. First, a method of checking the reading selection voltage in the reading driver 16 will be described. FIG. 4 is a flowchart showing the operation of the nonvolatile semiconductor storage device (method of inspecting or detecting a failure on the nonvolatile semiconductor storage device) according to the first embodiment of the present invention.

First, in the switch circuit 21, TP1 and TN1 are turned OFF, thereby blocking the path (wiring 28) from the REG charge pump 20 (Step S1). This prevents a circuit state on a side of the REG charge pump 20 from affecting failure inspection. Next, in the test circuit 22, TP6 and TN6 are turned ON, TN7 is turned OFF, and TP8 and TN8 are turned ON (Step S2). This makes the test circuit 22 operable.

Subsequently, in the writing/erasing driver 19, TP2 and TN2 are turned ON and TN3 is turned OFF. Thereby, the wiring 29 is connected to the word line WL and a voltage on the wiring 29 becomes a voltage Vwg1 on the word line WL. As a result, the voltage Vwg1 on the word line WL can be supplied to the test circuit 22 through the writing/erasing driver 19 and the wiring 29. After that, in the reading driver 16, TN4 is turned ON, TP5 is turned ON and TN5 is turned OFF (Step S3). Thereby, the reading selection voltage Vread in the reading driver 16 can be applied to the word line WL. An actual voltage on the word line WL appears as the voltage Vwg1 on the wiring 29.

Figure 1:
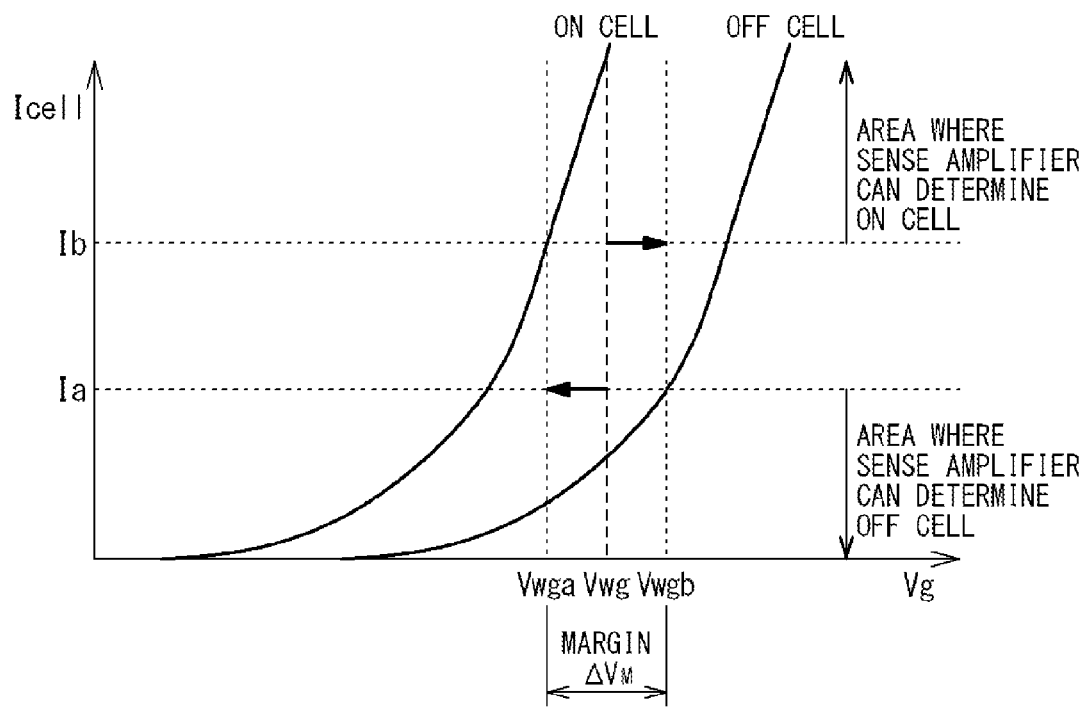
FIG. 1 is a graph schematically showing relationship between a current flowing to a flash memory cell and a word line voltage.

The voltage Vwg1 is supplied to the test circuit 22. A voltage Vwg2 that is equal to the voltage Vwg1 is supplied to the inverting inputs of the comparators COMP1 and COMP2. A voltage that is slightly higher than the reading selection voltage Vread (voltage that is higher than Vread by $\Delta V1$) as the reference voltage Vref1 is supplied to the non-inverting input of the comparator COMP1. On the other hand, a voltage that is slightly lower than the reading selection voltage Vread (voltage that is lower than Vread by $\Delta V1$) as the reference voltage Vref2 is supplied to the non-inverting input of the comparator COMP2. The reference voltage Vref1 is set to a value that is equal to or slightly smaller than Vwgb in FIG. 1. The reference voltage Vref2 is set to a value that is equal to or slightly larger than Vwga in FIG. 1. As a result, $2 \times \Delta V1$ becomes substantially equal to or smaller than a margin $\Delta V_M$ that is allowable for the reading selection voltage. In this manner, the comparators COMP1 and COMP2 compare the output voltage Vwg2 of the reading driver 16 with the reference voltages Vref1, Vref2 (Step S4).

The comparator COMP1 outputs "1" when Vref1 is equal to or larger than Vwg2 and outputs "0" when Vref1 is smaller than Vwg2. The comparator COMP2 outputs "1" when Vref2 is equal to or smaller than Vwg2 and outputs "0" when Vref2 is larger than Vwg2. When the reading driver 16 and the word line WL are normal, Vwg2 becomes equal to Vread. That is, since Vwg2 is equal to or less than Vref1 and equal to or more than Vref2, the output (out) of the test circuit 22 becomes "1". On the contrary, when the path of the reading driver 16 or the word line WL has a failure or a leak current is large, Vwg2 becomes larger than Vref1 or smaller than Vref2. As a result, the output (out) of the test circuit 22 becomes "0" (Step S5). In this manner, a failure can be detected based on the output (out) of the test circuit 22.

In the present embodiment, the test circuit 22 is connected to the output of the reading driver 16 so as to directly check the word line selection voltage. In this manner, it is possible to measure whether or not the word line selection voltage value falls within a desired voltage range defined by the plurality of reference voltages and ensure the wordline selection voltage value. In addition, whether or not a failure exists in the reading driver 16 can be detected based on absence or presence of abnormality in the word line voltage.

Next, a method of checking the reading non-selection voltage in the reading driver 16 will be described. FIG. 5 is a flowchart showing an operation of the nonvolatile semiconductor storage device (a method of inspecting or detecting a failure on the nonvolatile semiconductor storage device) according to the first embodiment of the present invention.

First, in the switch circuit 21, TP1 and TN1 are turned OFF, thereby blocking the path (wiring 28) from the REG charge pump 20 (Step S11). This prevents the circuit state on the side of the REG charge pump 20 from affecting failure inspection. Next, in the test circuit 22, TP6 and TN6 are turned OFF. This prevents the voltage Vwg1 on the word line WL from being supplied to the test circuit 22.

Subsequently, in the writing/erasing driver 19, TP2 and TN2 are turned ON and TN3 is turned OFF. As a result, the wiring 29 is connected to the word line WL and a voltage on the wiring 29 becomes the voltage Vwg1 on the word line WL. After that, in the reading driver 16, TN4 is turned ON, TP5 is turned OFF and TN5 is turned ON. This enables the reading non-selection voltage GND to be supplied from the reading driver 16 to the word line WL. At this time, by measuring a current on an application path to which the reading selection voltage Vread is applied (path on a side of the pMOS transistor TP5), whether or not TP5 is normally turned OFF is checked (Step S12). The current on the application path can be measured by means of a current measuring circuit (not shown) provided in the path or an external tester (not shown) connected to the path through an external connection terminal (not shown).

Next, in the test circuit 22, TP6 and TN6 are turned ON, TN7 is turned ON, and TP8 and TN8 are turned ON (Step S13). This makes the test circuit 22 operable. As a result, the voltage Vwg1 on the word line WL can be supplied to the test circuit 22 through the writing/erasing driver 19 and the wiring 29.

At this time, the voltage Vwg1 is supplied to the test circuit 22. The voltage Vwg2 that is equal to the voltage Vwg1 is supplied to the inverting inputs of the comparators COMP1 and COMP2. As the reference voltage Vref1, 0 V as the reading non-selection voltage is supplied to the non-inverting input of the comparator COMP1. Similarly, as the reference voltage Vref2, 0 V as the reading non-selection voltage is supplied to the non-inverting input of the comparator COMP2. In this manner, the output voltage Vwg2 of the reading driver 16 is compared with the reference voltages Vref1 and Vref2 by the comparators COMP1 and COMP2, respectively (Step S14).

Incidentally, a voltage that is slightly higher than 0 V (voltage that is higher than 0 V by ΔV2) as the reference voltage Vref1 may be supplied to the non-inverting input of the comparator COMP1. Similarly, a voltage that is slightly lower than 0 V (voltage that is lower than 0 V by ΔV2) as the reference voltage Vref2 may be supplied to the non-inverting input of the comparator COMP2. Here, 2×ΔV2 may be substantially equal to a margin that is allowable for the reading non-selection voltage.

Here, since the nMOS transistor TN7 is turned ON, the power source voltage VDD is applied to Vwg2. However, the current driving capability of the nMOS transistor INS is much larger than that of the nMOS transistor TN7. Accordingly, when the nMOS transistor TN5 operates normally, even if the power source voltage VDD is supplied through the nMOS transistor TN7, an effect of the power source voltage VDD on the word line voltage (including Vwg1, Vwg2) is extremely small and thus, a substantial increase in the voltage becomes zero. Conversely, when the nMOS transistor TN5 does not operate normally or a failure exists in the path including the word line WL, resulting in that the word line WL is put into a Hiz (high impedance) state, if the power source voltage VDD is supplied through the nMOS transistor TN7, the word line voltage (including Vwg1, Vwg2) increases and reaches VDD, for example. Accordingly, it can be detected by the subsequent COMP1 and COMP2.

That is, the comparator COMP1 outputs "1" when Vwg2 is equal to or smaller than 0 and outputs "0" when Vwg2 is larger than 0. The comparator COMP2 outputs "1" when Vwg2 is equal to or larger than 0 and outputs "0" when Vwg2 is smaller than 0. When the reading driver 16 and the word line WL are normal, Vwg2 is 0. In other words, since Vwg2 is equal to or smaller than Vref1 and equal to or larger than Vref2, the output (out) of the test circuit 22 becomes "1". On the contrary, as described above, when a failure exists in the reading driver 22 or the path of the word line WL or a leak current is large, Vwg2 becomes larger than Vref1 or smaller than Vref2. As a result, the output (out) of the test circuit 22 becomes "0" (Step S15). In this manner, a failure can be detected based on the output (out) of the test circuit 22.

In the present embodiment, the test circuit 22 is connected to the output of the reading driver 16 to directly check the word line non-selection voltage. Thereby, it is possible to measure whether or not the word line non-selection voltage value falls within a desired voltage range defined by the plurality of reference voltages and ensure the word line selection voltage value. In addition, whether or not a failure exists in the reading driver 16 can be detected based on absence or presence of abnormality in the word line voltage.

As has been described, in the present embodiment, in the reading driver 16, the voltage (selection voltage, non-selection voltage) is applied to the word line WL and the actual word line WL voltage at this time is compared with the plurality of reference voltages by the test circuit 22. Thereby, it is possible to measure whether or not each of the actual selection voltage and non-selection voltage on the word line WL falls within the desired voltage range and ensure the voltage value. Further, by blocking the path (wiring 28) from the REG charge pump 20 by the switch circuit 21, the output of the reading driver 16 (voltage on the word line) can be compared with the plurality of reference voltages through the writing/erasing driver 19 by the test circuit 22 without being affected by a state of the electronic circuit ahead of the path. Therefore, abnormality in the reading driver 16 and the word line WL can be suitably detected.

(Second Embodiment)

A nonvolatile semiconductor storage device including a failure detection circuit according to a second embodiment of the present invention will be described with reference to attached drawings.

Figure 6:
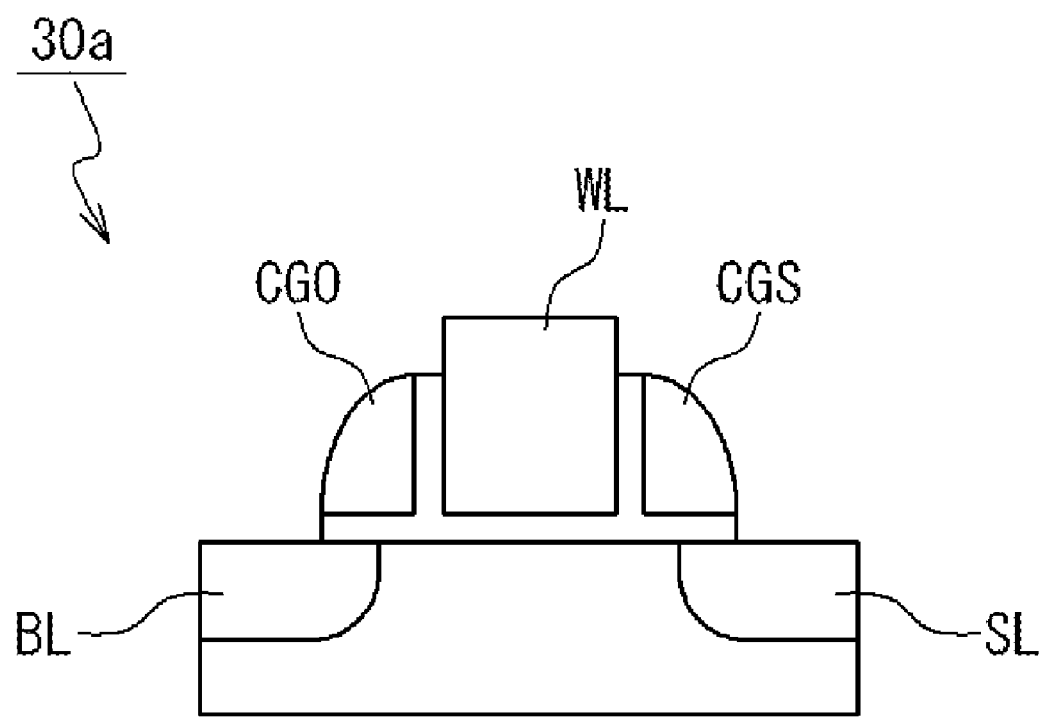
FIG. 6 is a sectional view schematically showing a configuration of a memory cell of a nonvolatile semiconductor storage device according to a second embodiment of the present invention.

First, a configuration of the nonvolatile semiconductor storage device according to the second embodiment of the present invention will be described referring to FIGS. 2, 6 and 7. FIG. 2 is a block diagram showing a configuration of the nonvolatile semiconductor storage device according to the second embodiment of the present invention. The configuration in the present embodiment is the same as that in the first embodiment. FIG. 6 is a sectional view schematically showing a configuration of a memory cell of the nonvolatile semiconductor storage device according to the second embodiment of the present invention. The present embodiment is different from the first embodiment in that a Twin-MONOS flash memory cell as one type of the flash memory cell is used as a memory cell 30a. In this case, in each memory cell 30a, a word line WL is connected to a word gate, a control line CGS is connected to a control gate on one side, a control line CGO is connected to a control gate on the other side, a bit line BL is connected to a drain and a source line SL is connected to a source. Operations of the memory cell 30a are controlled by voltages supplied to the lines.

Incidentally, as shown in FIG. 6, the word line WL and the word gate may be integrated with each other. Similarly, the control line CGS and the control gate on one side may be integrated with each other. Also, the control line CGO and the control gate on the other side may be integrated with each other.

Figure 7:
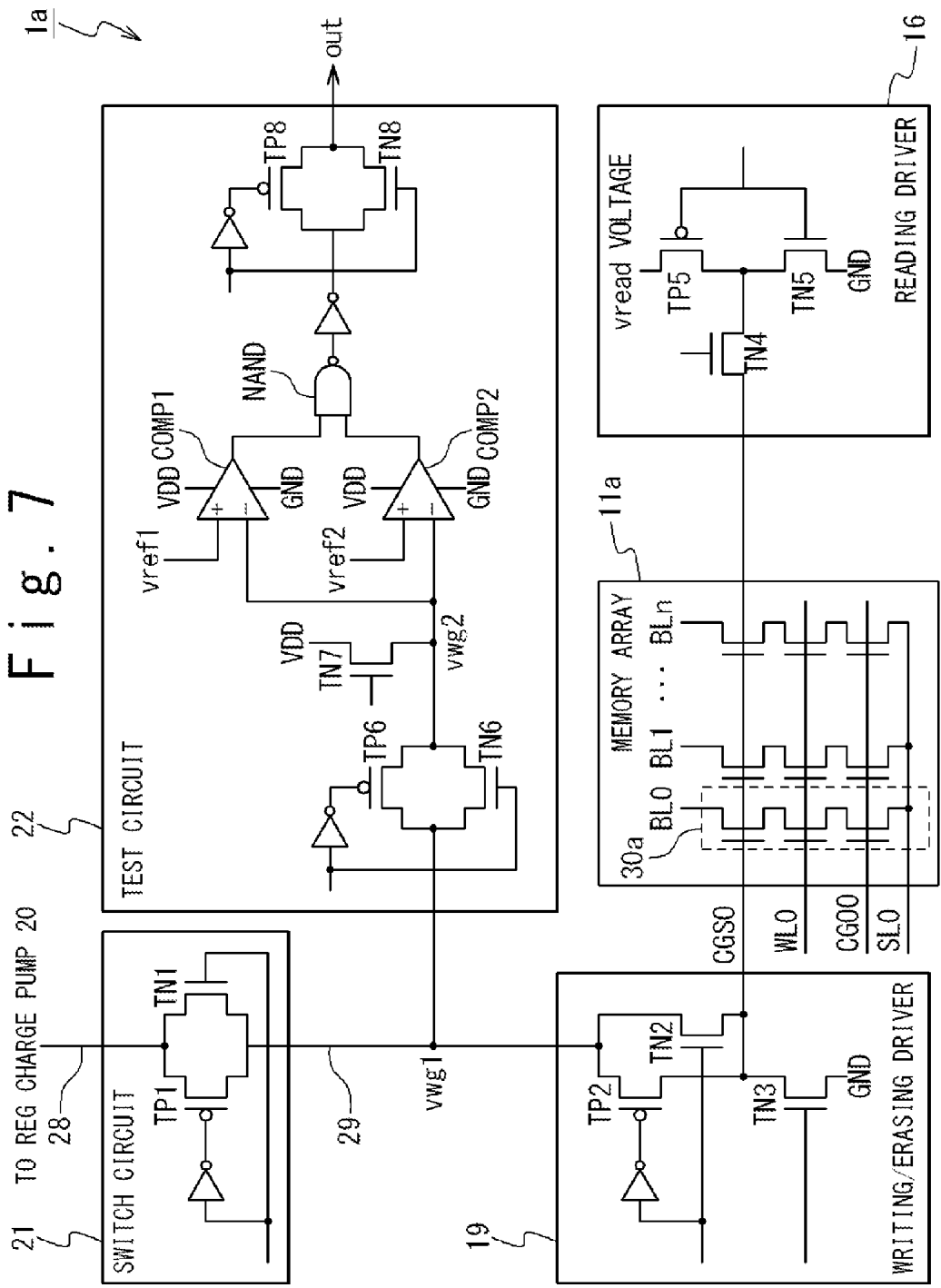
FIG. 7 is a block diagram showing a configuration of a test circuit and the surroundings according to the second embodiment of the present invention.

FIG. 7 is a block diagram showing a configuration of a test circuit and the surroundings according to the second embodiment of the present invention. The present embodiment is different from the first embodiment in that in the nonvolatile semiconductor storage device 1a, the test circuit 22 is not disposed in the voltage path of the word line WL, but disposed in the voltage path of the control line CGS. Since it is also important to ensure the voltage value (selection voltage, non-selection voltage) on the control line CGS in the Twin-MONOS memory cell 30a, a circuit configuration shown in FIG. 7 is employed, in which the word line WL in the first embodiment is changed to the control line CGS.

This figure shows details of the test circuit 22, the switch circuit 21, the writing/erasing driver 19, the memory array 11a and the reading driver 16. As for each of the memory array 11a, the reading driver 16 and the writing/erasing driver 19, the portions related to only one control line CGS, one control line CGO and one word line WL (control lines CGS0, CGO0, word line WL0) are shown.

The portions related to the other control lines CGS (CGS1, . . . , CGSn), CGO (CGO1, . . . , CGOn) and word lines WL (WL1, . . . , WLn) are the same as the portions shown in this figure.

Configurations of portions related to the control lines CGS, CGO and the word line WL in the reading driver 16 and the writing/erasing driver 19 are the same as those of portions related to the word line WL in the first embodiment. Configurations of the switch circuit 21 and the test circuit 22 are also the same as those in the first embodiment. Further, configurations of other portions in the nonvolatile semiconductor storage device 1a are the same as those in the first embodiment as shown in FIG. 2.

Since operations of the nonvolatile semiconductor storage device (method of inspecting or detecting a failure on the nonvolatile semiconductor storage device) according to the second embodiment of the present invention are the same as those in the first embodiment except that the control line CGS, not the word line WL, is inspected, description thereof is omitted.

In the present embodiment, by comparing the voltage (selection voltage, non-selection voltage) on the control line CGS with the plurality of reference voltages by means of the test circuit 22, it is possible to measure whether or not the selection voltage and the non-selection voltage on the control line CGS fall within a desired voltage range and ensure the voltage value. Further, by blocking the path (wiring 28) from the REG charge pump 20 by the switch circuit 21, the output of the reading driver 16 (voltage on the control line CGS) can be compared with the plurality of reference voltage through the writing/erasing driver 19 by the test circuit 22 without being affected by the state of the electronic circuit ahead of the path. Therefore, abnormality in the reading driver 16 and the control line CGS can be suitably detected.

Although description is made with respect to the control line CGS in the above-mentioned embodiment, the present invention is not limited to this example. For example, the above-mentioned failure inspection with respect to the control line CGO may be performed. Further, the above-mentioned failure inspection with respect to two lines among the control lines CGS, CGO and the word line WL may be performed. Furthermore, the above-mentioned failure inspection with respect to all of the control lines CGS, CGO and word line WL may be performed. In these cases also, the same effects as those in the above-mentioned embodiments can be obtained.

According to the present invention, the test circuit 22 is connected to the output of the reading driver 16 (word line WL voltage, control line CGS/CGO voltage) to check the selection voltage value/non-selection voltage value. Thereby, it is made possible to accurately check and ensure with high accuracy that the selection voltage value/non-selection voltage value is applied to the word line WL and the control line CGS/CGO. In addition, since the word line WL voltage and the control line CGS/CGO voltage can be checked without time-consuming cell fine fabrication, it is expected to advantageously reduce test time.

The present invention relates to overall devices that mount a nonvolatile semiconductor storage device including a selection gate such as a flash memory embedded microcomputer and a general memory.

It is apparent that the present invention is not limited to the above-mentioned embodiments and may be appropriately modified and changed within the scope and spirit of the present invention. The techniques described in each embodiment can be applied to the other embodiment unless no technical contradiction arises.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A nonvolatile semiconductor storage device comprising:
   a word line configured to be connected to gates of a plurality of nonvolatile memory cell transistors;
   a reading circuit configured to be connected to one end of said word line and supply one of a reading selection voltage and a reading non-selection voltage to said word line; and
   a failure detection circuit configured to be connected to the other end of said word line and detect a voltage of said word line supplied with said one of said reading selection voltage and said reading non-selection voltage by comparing said voltage with a plurality of reference voltages.

2. The nonvolatile semiconductor storage device according to claim 1, wherein said failure detection circuit outputs a signal indicating abnormality when said detecting result is out of a voltage range defined based on said plurality of reference voltages.

3. The nonvolatile semiconductor storage device according to claim 1, further comprising:
- a writing and erasing circuit configured to be connected to the other end of said word line and supply at least one of a writing voltage and an erasing voltage to said word line; and
- a switch circuit configured to block a connection between said writing and erasing circuit and a circuit which supplies a voltage to said writing and erasing circuit,
- wherein said failure detection circuit is connected to the other end of said word line through said writing and erasing circuit in a side of said writing and erasing circuit with respect to said switch circuit,
- wherein said switch circuit blocks said connection when said failure detection circuit detects said voltage.

4. The nonvolatile semiconductor storage device according to claim 1, wherein said reading circuit supplies said reading non-selection voltage to said word line through a first transistor,
- wherein said failure detection circuit supplies a first voltage to said word line through a second transistor when said reading non-selection voltage is supplied to said word line,
- wherein said first voltage is higher than said reading non-selection voltage, and
- wherein a current driving capability of said first transistor is larger than that of said second transistor.

5. The nonvolatile semiconductor storage device according to claim 1, wherein each of said plurality of nonvolatile memory cell transistors includes a Twin-MONOS (Metal/Oxide/Nitride/Oxide/Silicon)-type cell,
- wherein said word line is at least one of a word line connected to a word gate of said Twin-MONOS-type cell and a control line connected to a control gate provided in a side of said word gate of said Twin-MONOS-type cell.

6. A method of detecting a failure on a nonvolatile semiconductor storage device, comprising:
- supplying one of a reading selection voltage and a reading non-selection voltage to a word line connected to gates of a plurality of nonvolatile memory cell transistors from one end of said word line; and
- detecting a voltage of said word line at the other end of said word line by comparing said voltage with a plurality of reference voltages.

7. The method of detecting a failure on a nonvolatile semiconductor storage device according to claim 6, wherein said detecting step includes:
- outputting a signal indicating abnormality when said detecting result is out of a voltage range defined based on said plurality of reference voltages.

8. The method of detecting a failure on a nonvolatile semiconductor storage device according to claim 6, further comprising:
- blocking a wiring through which at least one of a writing voltage and an erasing voltage is supplied when detecting said voltage.

9. The method of detecting a failure on a nonvolatile semiconductor storage device according to claim 6, wherein said supplying step includes:
- supplying said reading non-selection voltage to said word line through a first transistor,
- wherein said detecting step includes:
- supplying a first voltage to said word line through a second transistor when said reading non-selection voltage is supplied to said word line,
- wherein said first voltage is higher than said reading non-selection voltage, and
- wherein a current driving capability of said first transistor is larger than that of said second transistor.

10. The method of detecting a failure on a nonvolatile semiconductor storage device according to claim 6, wherein each of said plurality of nonvolatile memory cell transistors includes a Twin-MONOS (Metal/Oxide/Nitride/Oxide/Silicon)-type cell,
- wherein said word line is at least one of a word line connected to a word gate of said Twin-MONOS-type cell and a control line connected to a control gate provided in a side of said word gate of said Twin-MONOS-type cell.

* * * * *